(12) United States Patent
Dellinger et al.

(10) Patent No.: US 6,205,574 B1
(45) Date of Patent: Mar. 20, 2001

(54) METHOD AND SYSTEM FOR GENERATING A PROGRAMMING BITSTREAM INCLUDING IDENTIFICATION BITS

(75) Inventors: Eric F. Dellinger, San Jose; Roman Iwanczuk, Los Gatos, both of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/124,464

(22) Filed: Jul. 28, 1998

(51) Int. Cl.[7] .............................. G06F 17/50; H04Q 3/02
(52) U.S. Cl. .................... 716/16; 716/18; 340/825.83
(58) Field of Search ...... 716/1–21; 395/500.02–500.19; 326/38–39; 340/825.83–825.84

(56) References Cited

U.S. PATENT DOCUMENTS

| | | | |
|---|---|---|---|
| 3,849,760 | 11/1974 | Endou et al. | 340/146.3 |
| 5,321,704 | 6/1994 | Erickson et al. | 371/37.1 |
| 5,394,031 | 2/1995 | Britton et al. | 326/38 |
| 5,457,408 | 10/1995 | Leung | 326/38 |
| 5,581,738 | * 12/1996 | Dombrowski | 716/16 |
| 5,648,913 | * 7/1997 | Bennett et al. | 716/6 |
| 5,745,734 | * 4/1998 | Craft et al. | 716/16 |
| 5,946,478 | * 8/1999 | Lawman | 716/17 |

OTHER PUBLICATIONS

Murphy et al. ("FPGA Implementation of the Guided Scrambling Line Coding Technique", IEEE Conference on Electrical and Computer Engineering, 1998, vol. 2, pp. 742–745, May 24, 1998).*

"The Programmable Logic Data Book" Xilinx, Inc., 2100 Logic Drive, San Jose, CA 95124, pp. 4–315 to 4–318, Nov. 20, 1997.

"The Programmable Logic Data Book" copyright 1994, Xilinx, Inc., 2100 Logic Drive, San Jose, CA 95124, pp. 2–105 to 2–132.

David A. Patterson and John L. Hennessy, "Computer Architecture: A Quantitive Approach", pp. 200–201, 1990.

D.D. Gajski, et al, "Computer Architecture" IEEE Tutorial Manual, IEEE Computer Society, 1987, pp v–i.

Hodges, et al, "Analog MOS Integrated Circuits" IEEE Press, 1980, pp, 2–11.

* cited by examiner

Primary Examiner—Matthew Smith
Assistant Examiner—Phallaka Kik
(74) Attorney, Agent, or Firm—LeRoy D. Maunu; Edel M. Young

(57) ABSTRACT

A method and system for generating a programming bitstream for a programmable gate array. A programming bitstream for the programmable gate array is generated in response to an input design specification. The programming bitstream includes one or more unused segments, either interspersed through the bitstream or appended to the end of the bitstream, wherein an unused segment includes bits that are not used for programming the programmable gate array. One or more selected items of information are encoded to form binary representations of the items. The binary representations are inserted into one or more of the unused segments of the programming bitstream.

20 Claims, 8 Drawing Sheets

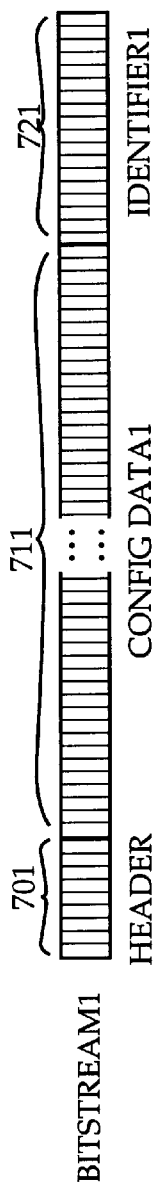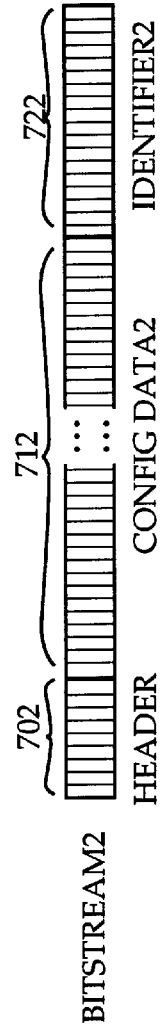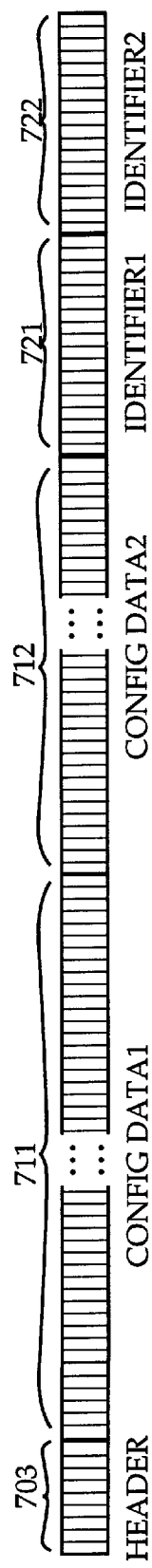
FIG. 7A
FIG. 7B
FIG. 7C

METHOD AND SYSTEM FOR GENERATING A PROGRAMMING BITSTREAM INCLUDING IDENTIFICATION BITS

FIELD OF THE INVENTION

The present invention generally relates to field programmable gate arrays, and more particularly to methods and systems for generating programming bitstreams for field programmable gate arrays.

BACKGROUND OF THE INVENTION

Field programmable gate arrays (FPGAs), first introduced by XILINX in 1985, are becoming increasingly popular devices for use in electronics systems. For example, communications systems employ FPGAs in large measure because of the re-programmability of FPGAs. In general, the use of FPGAs continues to grow at a rapid rate because they permit relatively short design cycles, reduce costs through logic consolidation, and offer flexibility in their re-programmability.

The re-programmability of FPGAs, while a chief advantage of FPGAs over other solutions, has also created challenges to users of FPGAs, as well as to field engineers and other support personnel. Specifically, to trace the content of a particular FPGA programming bitstream, a user may need to reference identifying characteristics of certain design modules that are not readily available. The reason for the need to ascertain these characteristics arises from the fact that the design modules that are embodied in the programming bitstream have associated therewith characteristics such as logic core identifiers, revision levels, timestamps and assorted other information, and the identification of these characteristics may be necessary in order to troubleshoot problems that may arise from use of a particular design module with a particular FPGA. However, quickly identifying the characteristics may be cumbersome and time consuming depending upon how such information is managed.

In addition to the content of an FPGA programming bitstream, the software tools used to generate the bitstream may also impact operability. For example, when support personnel are presented with a programming bitstream which does not program a FPGA to function as expected, one consideration is the compatibility of the software tool with the particular FPGA. In addition, there may be compatibility issues between different versions of the software tool and revision levels of FPGAs. As with identification of the contents of the programming bitstream, identifying the software tools may be cumbersome or impossible depending upon how such information is managed.

Therefore, a method and system that addresses the aforementioned problems, as well as other related problems, are desirable.

SUMMARY OF THE INVENTION

A method and apparatus for generating a programming bitstream for a programmable gate array are provided in various embodiments of the invention. Certain segments of a programming bitstream generated from an input design specification are unused for storing programming bits. Selected items of information are encoded and stored in the unused segments of the programming bitstream.

In a first embodiment, a method is provided for generating a programming bitstream for the programmable gate array in response to an input design specification. The programming bitstream includes one or more unused segments, wherein an unused segment includes bits that are not used for programming the programmable gate array. One or more selected items of information are encoded to form binary representations of the items. The binary representations are inserted into one or more of the unused segments of the programming bitstream.

In another embodiment, a method is provided for generating a programming bitstream for a programmable gate array and ascertaining identification information from the programming bitstream. One or more selected items of information are encoded to form binary representations of the items. The binary representations are inserted into one or more of the unused segments of the programming bitstream. Binary representations of the items of information are read from the unused segments and the binary representation are decoded into the selected items of information.

A method for ascertaining identification information from a programming bitstream for a programmable gate array is provided in yet another embodiment. One or more of the unused segments have encoded therein binary representations of one or more selected items of information. The method comprises reading from at least one of the unused segments of the programming bitstream binary representations of one or more selected items of information. The binary representations are decoded into the selected items of information.

In another embodiment, an apparatus for generating a programming bitstream for a programmable gate array comprises: means for generating a programming bitstream for the programmable gate array including one or more unused segments in response to an input design specification; means for encoding one or more selected items of information to form binary representations of the items; and means for inserting the binary representations into one or more of the unused segments of the programming bitstream.

A system for generating a programming bitstream for a programmable gate array is yet another embodiment of the invention. The system comprises a bitstream generator configured to generate a programming bitstream responsive to an input design specification. The programming bitstream has one or more unused segments that are not used for programming the programmable gate array. An information encoder is coupled to the bitstream generator and configured to encode one or more selected items of information into respective binary representations and insert the binary representations into one or more of the unused segments of the programming bitstream.

In yet another embodiment, identification bits are appended to the bitstream rather than inserted into unused bits. In this embodiment, the bitstream is lengthened in order to accommodate the identification bits. The process for generating the bitstream of this embodiment is simpler than that of inserting identification bits into an existing bitstream, since the improved bitstream can simply be formed by adding the identification bits to the end of an existing bitstream. The improved bitstream is usually compatible with an older bitstream even though the bitstream must be made longer to accommodate the added bits. Typically, a header at the beginning of the bitstream specifies the length of the bitstream. This header is revised to specify the added length. In the FPGA, the added identification bits are simply passed through the device and not used.

In a combination embodiment, some identification bits are embedded in the bitstream and additional bits are appended to the bitstream.

BRIEF DESCRIPTION OF THE DRAWINGS

Other aspects and advantages of the invention will become apparent upon seeing the following detailed description and upon reference to the drawings in which:

FIGS. 7A, 7B, and 7C show the information provided in bitstreams generated for one, one, and two FPGAs, according to another embodiment of the invention.

Figure 1A:
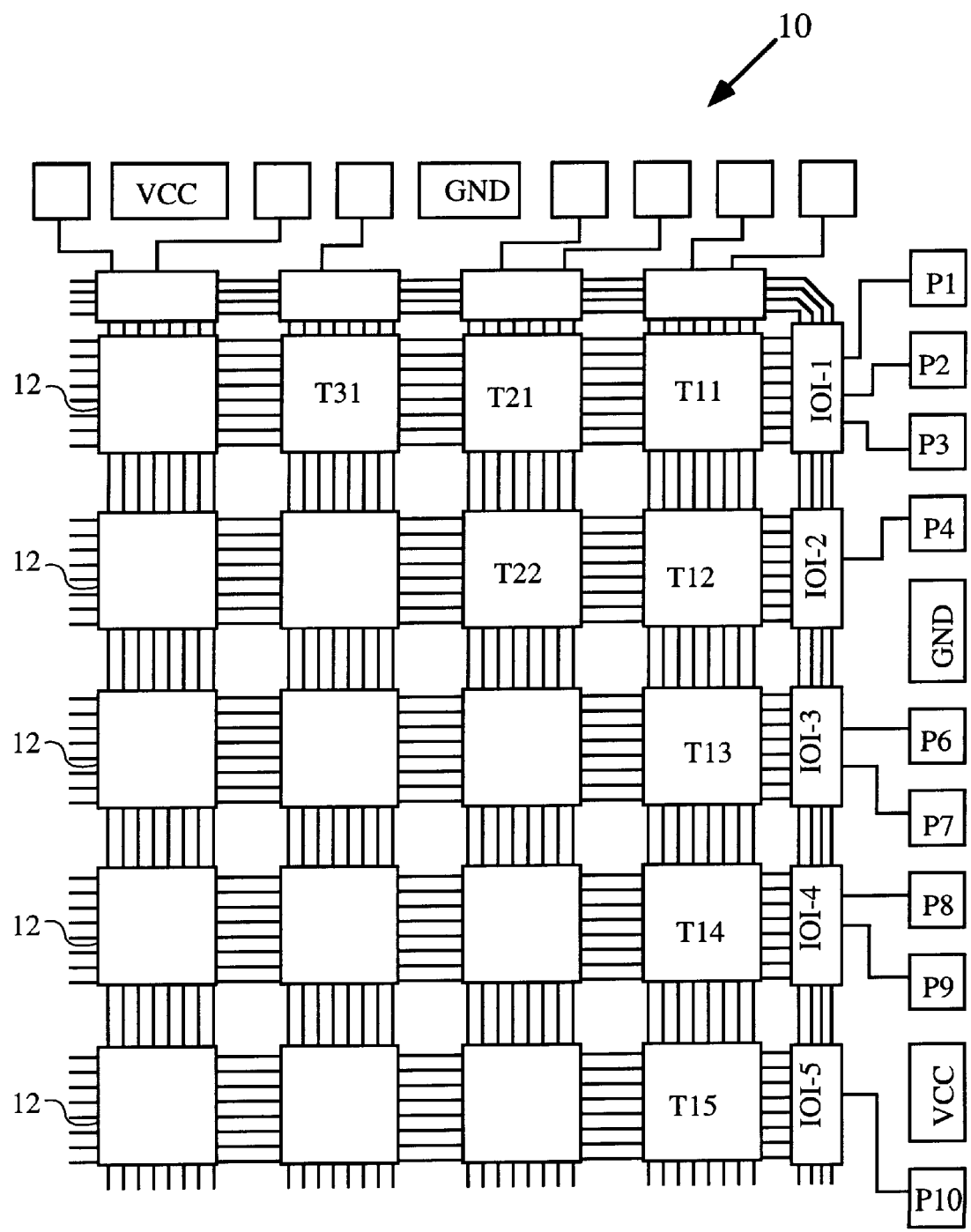
FIG. 1A shows a block diagram of a portion of an example field programmable gate array (FPGA) 10 with which the present invention may be used.

While the invention is susceptible to various modifications and alternative forms, specific embodiments thereof have been shown by way of example in the drawings and will herein be described in detail. It should be understood, however, that the detailed description is not intended to limit the invention to the particular forms disclosed. On the contrary, the intention is to cover all modifications, equivalents, and alternatives falling within the spirit and scope of the invention as defined by the appended claims.

DETAILED DESCRIPTION OF THE DRAWINGS

The present invention is believed to be applicable to a variety of systems for generating a programming bitstream for programmable logic devices. The present invention has been found to be particularly applicable and beneficial in generating programming bitstreams for field programmable gate arrays (FPGAs). While the present invention is not so limited, an appreciation of the present invention is presented by way of a particular example application, in this instance, in the context of and example system for generating a programming bitstream for an FPGA.

In various arrangements for programming FPGAs, a programming bitstream is generated that includes more bits than there are memory cells available to program. That is, some of the bits in the programming bitstream are unused for programming. This may occur, for example, for an FPGA that is not fully populated with SRAM. The extra unused bits are included in the bitstream, interspersed with the programming bits, instead of not including unused bits. The unused bits are included (1) for convenience in generating a bitstream if the SRAM is expanded and (2) simplifying the FPGA logic used to write the bits to SRAM. The present invention makes use of the unused bits by encoding in them information to identify, for example, logic cores used in generating the programming bitstream, software tools, software version numbers, timestamps, design change identifiers, authenticity codes, design names, design revision levels, design authors and various other types of information.

Before discussing the method and system of the present invention, a brief overview of an example field programmable gate array (FPGA) architecture is set forth in the following paragraphs which describe FIGS. 1A–B and 2.

Figure 1B:
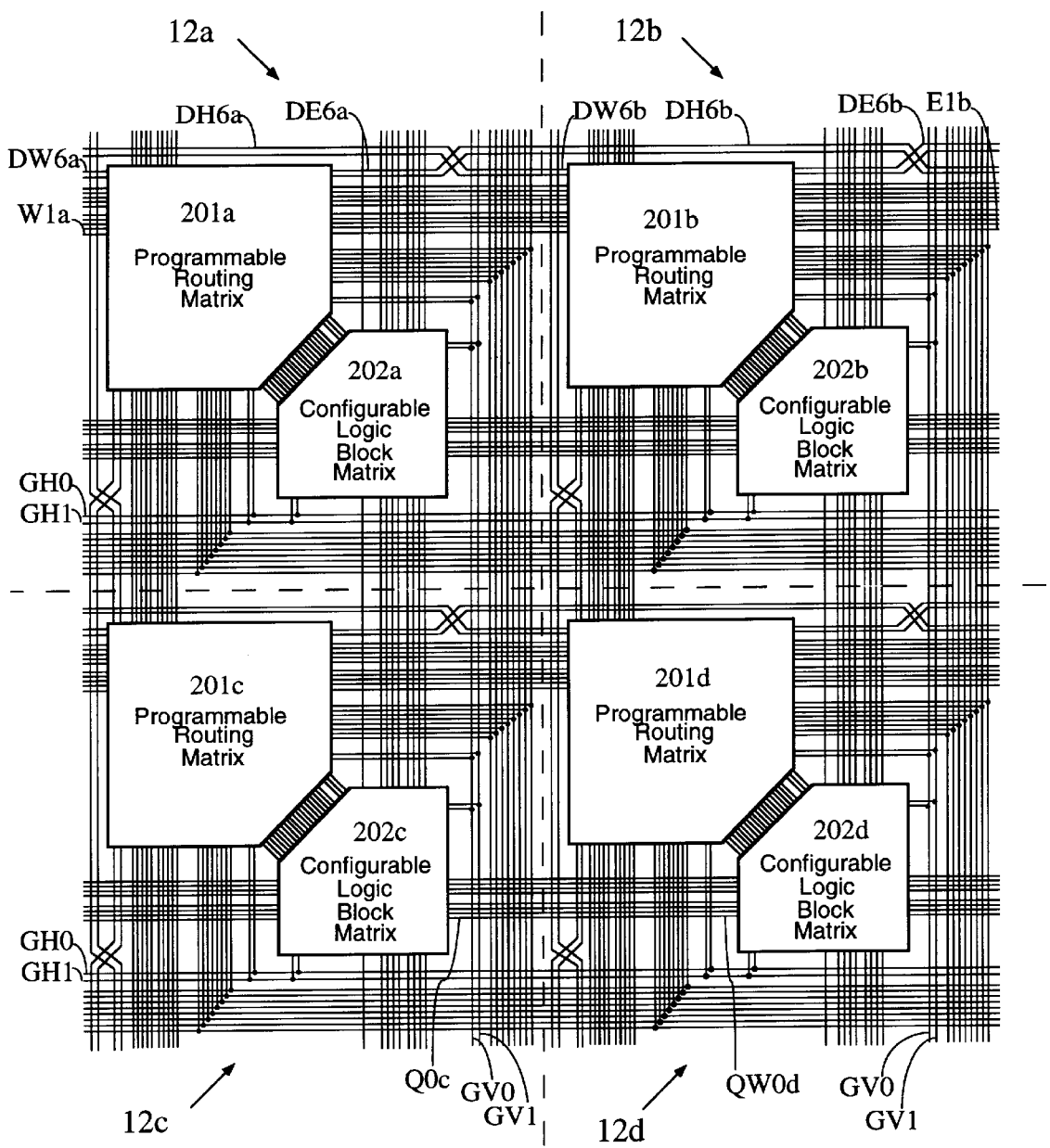
FIG. 1B is a block diagram of a portion of an example FPGA in which interconnections between tiles of the FPGA are illustrated.

FIG. 1A shows a block diagram of a portion of an example field programmable gate array (FPGA) 10 with which the present invention may be used. The FPGA 10 comprises a plurality of tiles 12. The tiles 12 are arranged in an array as shown in FIG. 1A. As shown in FIG. 1B, each of tiles 12a–d includes a programmable routing matrix, for example, 201a–d, and a configurable logic block matrix, for example, 202a–d. Each tile 12 has a group of configuration memory cells (not shown) associated with it. Some of the associated memory cells are coupled to a configurable logic block matrix, for example 202a and some are coupled to the programmable routing matrix, for example 201a. Depending on the data stored in the associated group of memory cells, each logic block matrix may be configured to perform one of a variety of logic functions. The inputs and outputs of each logic block matrix 202a–d, for example, may also be coupled, through the programmable routing matrices 201a–d, to the inputs and outputs of other logic blocks or the inputs and outputs of the FPGA 10 in any one of a number of configurations. The coupling of the inputs and outputs is also specified by data stored in the associated group of memory cells.

Figure 2:
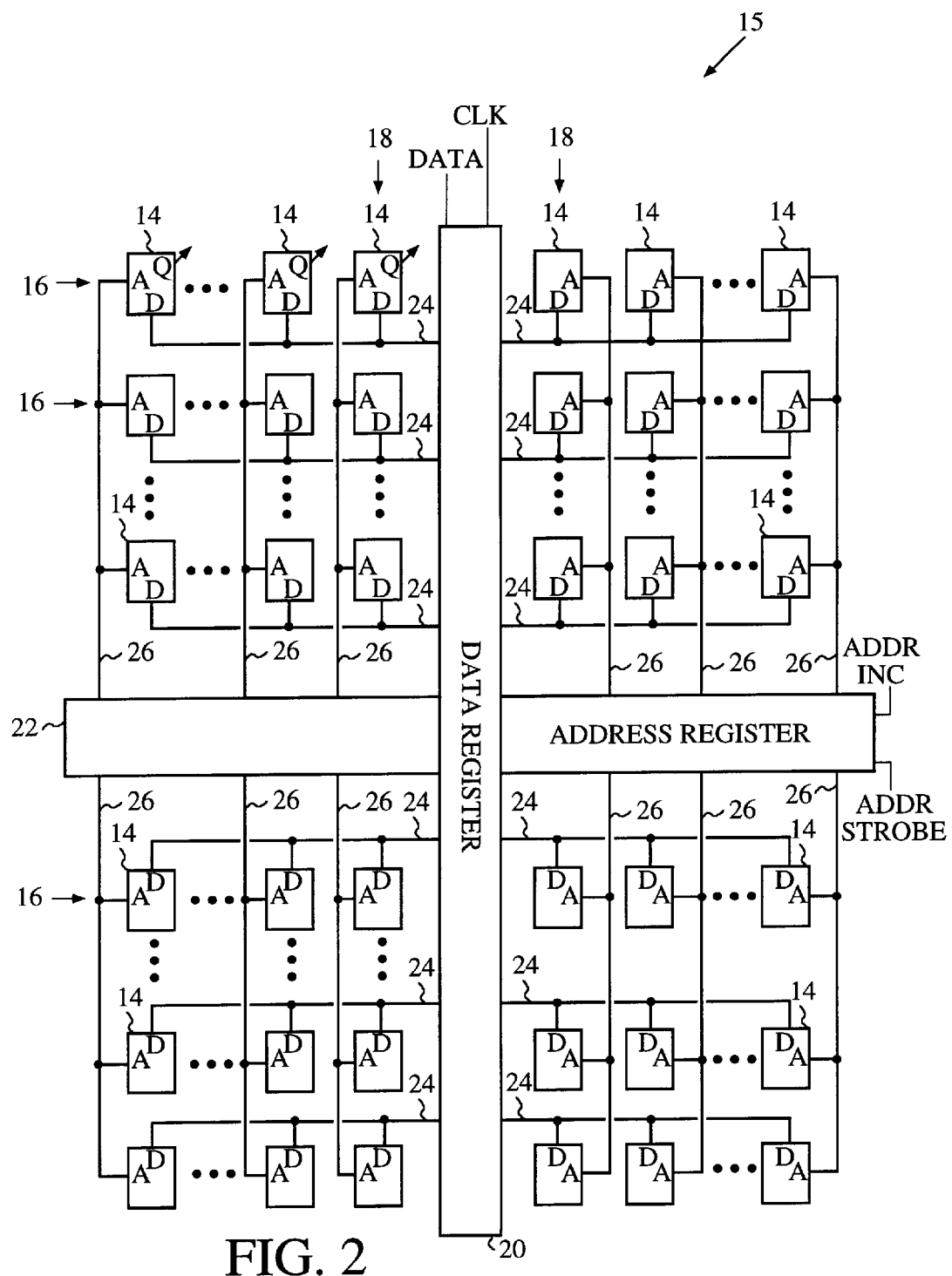
FIG. 2 is a block diagram of example memory cells for an FPGA.

Referring now to FIG. 2, a block diagram of example configuration memory cells 14 for the FPGA 10 is shown. The memory cells 14 are arranged on the FPGA 10 as an array 15 in rows 16 and columns 18 of cells 14. The array 15 of memory cells 14 illustrates only a portion of all memory cell in an FPGA 10. Additional rows and columns of similarly coupled memory cells 14 are represented in FIG. 2 by ellipses. The memory cells 14 are spaced apart across the FPGA 10 so that the cells 14 are positioned proximate the tile 12 with which they are associated. This arrangement advantageously reduces the area on the FPGA 10 that must be provided for interconnect structures that couple the memory cells 14 to their associated programmable routing matrix 201 and configurable logic block matrix 202.

In addition to having an output (not shown) that is coupled to one or several transistors of the appropriate tile 12, each of the memory cells 14 has an address input and a data input. In response to a signal on the address input, the signal applied to the data input is loaded into the memory cell 14. The memory cells 14 are static random access memory (SRAM) cells, for example. However, those skilled in the art will realize that the memory cells 14 may be implemented with other circuits such as an array of D-flip-flops or EPROM cells. A plurality of row buses 24 and column buses 26 are provided for coupling the data inputs and the address inputs, respectively, of the memory cells 14. Each time the address signal is asserted on a column bus 26, all the memory cells 14 in that column are loaded or written. Therefore, one column of data bits can be simultaneously written to the array 15 when the address is strobed.

A data register 20 stores a column of data before it is loaded into a column 18 of memory cells 14. The data register 20 is a shift register having a data input, a CLK input and a plurality of data outputs, for example. The data register 20 stores a plurality of bits equal in number to the number of rows 16 of the array 15. Each data output of the data register 20 is coupled by a respective row bus 24 to the memory cells 14 in a respective row 16 of the array 15. The data input of the data register 20 is coupled to receive a bit stream of data to be loaded into the memory cells 14, and the CLK input is coupled to receive a CLK signal indicating the time when the data register should be clocked or shifted.

An address register 22 is provided for specifying the column 18 of the array 15 that is to be loaded with data from the data register 20. The address register 22 is a shift register having a serial input, an address increment input (ADDR INC input), an address strobe input (ADDR STROBE input) and a plurality of address outputs 26. The address register 22 has a number of stages equal to the number of columns 18 in the array 15. Each stage stores a bit that specifies whether a particular column is to be addressed. Each stage also provides one of the plurality of address outputs. Each of the plurality of address outputs is part of a respective column bus 26 coupled to the address input of memory cells 14 in a respective column 18 of the array 15. The address increment input provides a way of shifting a token select bit through the address register 22.

Figure 3:
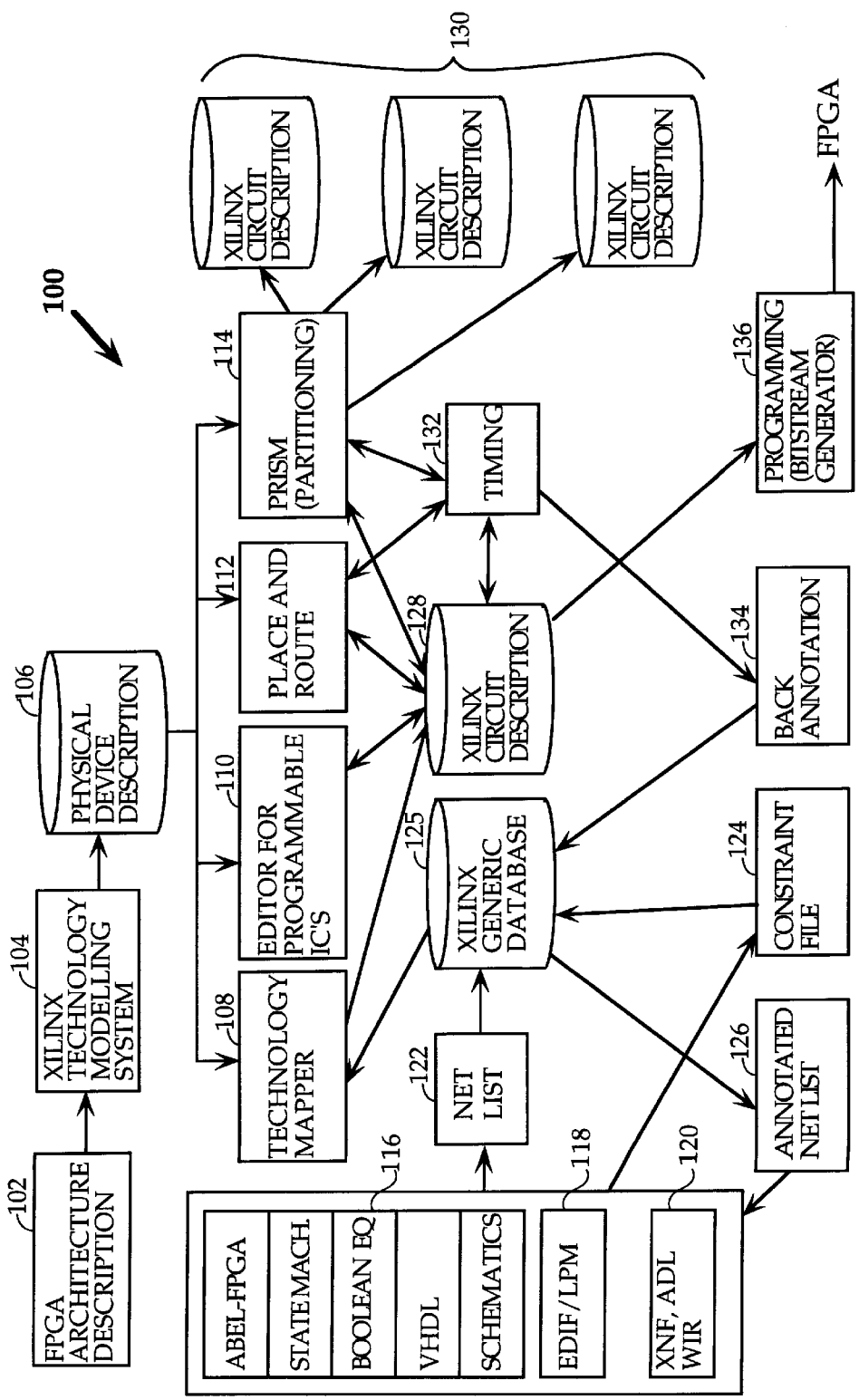
FIG. 3 is a design flow diagram that illustrates an example system and method in which the present invention may be used.

FIG. 3 is a design flow diagram that illustrates an example system and method in which the present invention may be used. The example design flow 100 may be used with the Xilinx Alliance Series™ device-independent modular tool set for FPGA design on conventional computer platforms. (Xilinx Alliance Series is a trademarks of Xilinx, Inc., assignee of the present application.) The FPGA architecture description block 102 and Xilinx technology modeling system block 104 produce the physical device description of block 106. From the physical device description block 106, the design flow 100 proceeds to a technology mapper 108, an editor for programmable IC's 110, place and route 112, and a device independent logic partitioning system.

The design flow 100 begins with the design capture block 116, which comprises a number of possible behavioral or hardware description languages such as Abel or VHDL, as well as state machine, Boolean equation or schematic representations or a combination of these representations. Many FPGA designs are captured using schematics. Electronic Design Interchange Format (EDIF) 118, and Xilinx Net list File (XNF) 120 both produce a net list 122 comprising a logic description of the design. The constraint file 124, which interacts with the design capture block 116, includes design preferences and, with the net list 122, provides input to a Xilinx Generic Database (XGD) 125 for subsequent input to the technology mapper 108 to generate an annotated net list 126 to the design capture block 116. The technology mapper 108 in conjunction with the editor 110, place and route 112, and logic-partitioning system 114 develops a Xilinx Circuit Description (XCD) 128. By use of the logic-partitioning system 114, a number of XCDs 130 may be developed partitioning the design across multiple FPGAs. The XCDs 128, 130 are supplied as input to the timing module 132, which supplies inputs to the back annotation block 134 of the XGD 125. The XCDs 128, 130 furnish the necessary binary output to programming block 136 to be applied to the target FPGA to program the device to function in accordance with the circuit design.

Figure 4:
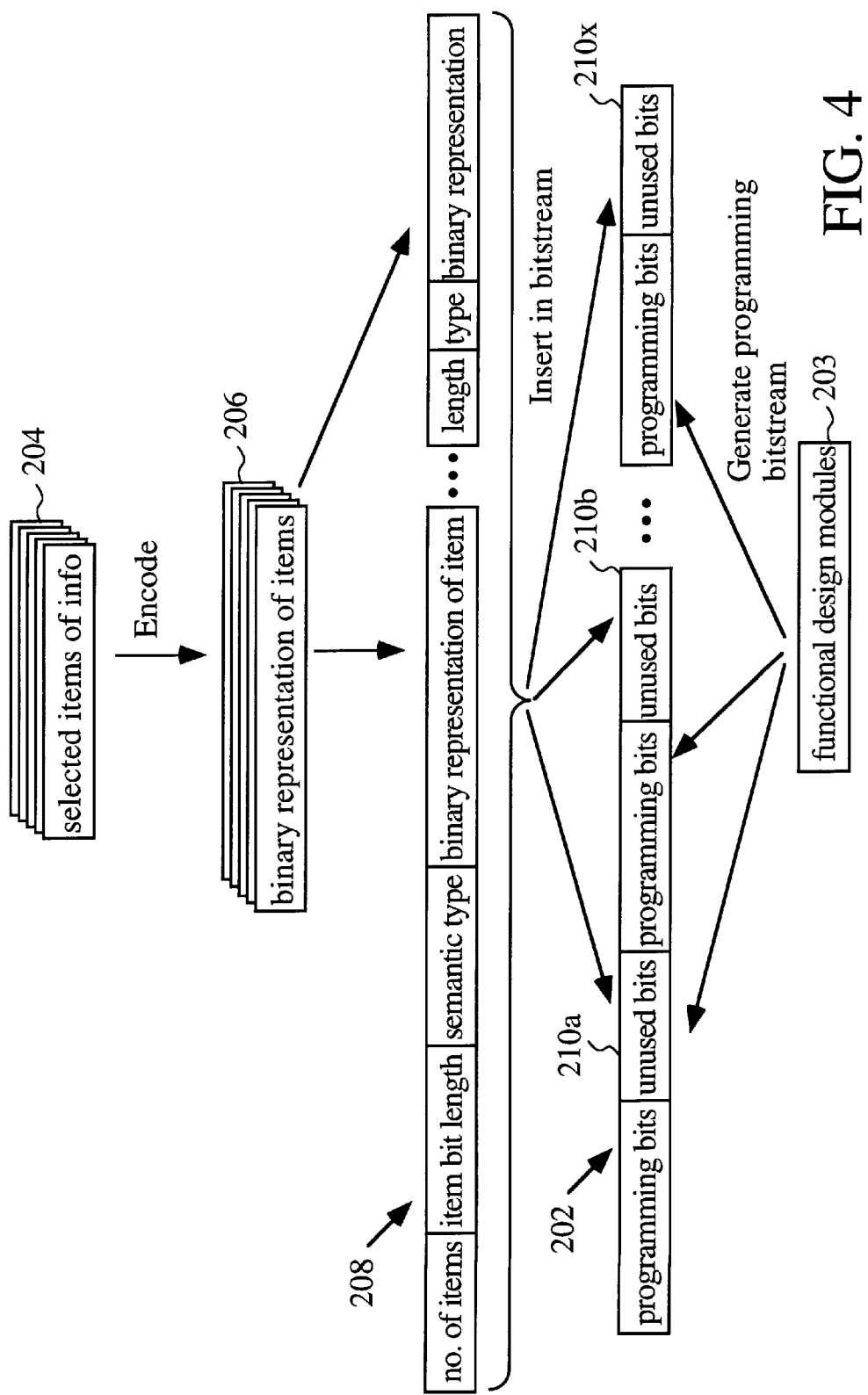
FIG. 4 is a data diagram that illustrates the information provided in a programming bitstream in accordance with an example embodiment of the invention.

FIG. 4 is a data diagram that illustrates the information provided in a programming bitstream in accordance with an example embodiment of the invention. The programming bitstream 202 corresponds, in one embodiment, to the output of the programming bitstream generator 136 of FIG. 3. This embodiment is further illustrated in FIG. 5. In another embodiment, the programming bitstream output from generator 136 is post-processed by a tool that then provides as its output programming bitstream 202. This other embodiment is shown in FIG. 6. The functional design modules 203 from which the programming bitstream 202 is generated correspond to the design information of the design capture block 116 of FIG. 3, for example.

Continuing now with FIG. 4, blocks 204 illustrate selected items of information to be encoded for inclusion in a programming bitstream. An example algorithm for implementing the encoding/decoding can be used in both embodiments, i.e., where the bitstream is post-processed and where the bitstream generator 136 (FIG. 3) generates the programming bitstream with the encoded information. The encoding process includes two phases: 1) encoding the information into bit vectors, and 2) inserting the bit vectors for all information into the bitstream's unused bits.

In encoding the selected information, binary representations of the various possible data types may be used. Block 206 illustrates the collection of bit vectors encoded from the selected items of information 204. A bit vector of the binary representations is created as described by the pseudo-code set forth below:

Create an empty bit vector, B.
If the information is a text string, then:
    For each character in the text:
        Convert the uni-code binary representation of the character to a binary string; and
        Append the binary string to bit vector B.
    End loop.
Else if the information is a Boolean value, then
    Append a 0 or 1 to the bit vector B.
Else if the information is a number then
    Convert the 32-bit binary representation of the number to a binary string; and
    Append the binary string to the bit vector B.
Return bit vector B.

A set of semantic information types is used so that a binary representation may be interpreted in a selected context. For example, a timestamp may be construed not only as a text string, but as a string with a particular format that is recognized by both encoding and decoding functions. In the pseudo-code set forth below, a bit vector is created, as illustrated by bit vector 208, that includes the encoded items along with the semantic types. In the example, it is assumed that there are no more than 256 such semantic types and that the number of bits in a given bit vector does not exceed 65,535.

Create an empty bit vector, V.
Append number of items to V (16 bits).
For each information item, I:
    Encode I into bits;
    Append length in bits of I to V (16 bits);
    Append semantic type of I in bits to V (8 bits); and
    Append I bits to V.
Set bitmap address to first bit in bitstream.
For each bit in V:
    Increment address until unused bit is found; and
    Set that bit to the current V bit.
End loop.

After the bit vector 208 is created, it is merged with the programming bitstream 202. Specifically, the bits from the vector 208 are written to the unused bit segments 210a, 210b, . . . , 210x of the programming bitstream. It will be appreciated that the bits from the bit vector 208 can be written into the bitstream 202 in an order other than an order in which the binary representations 206 of the items were generated. That is, the data can be scrambled so that it is not easily decoded without knowing the scrambling technique.

The decoding of the information in the unused bits involves reading into memory the whole bitstream and identifying unused bits as the bitstream is traversed. Each information item is parsed as an 8-bit semantic type and a bit-encoded Boolean, integer, or character string. An example method for decoding the information in the unused bits is set forth in the pseudo-code below. The example assumes that the items of information in the bitstream are not scrambled. Those skilled in the art will appreciate that the processing below can be modified to decode the scrambled information.

```
Get first 16 unused bits from bitstream.
Convert those bits to an integer, NUMITEMS.
Set ITEMCOUNT to 1.
Loop
    Get next 8 unused bits from bitstream.
    Convert those bits to an integer SEMANTICTYPE.
    If SEMANTICTYPE is Boolean data, then:
        Get the next unused bit in the bitstream; and
        Set the information value to that bit value.
    Else if SEMANTICTYPE is integer data, then:
        Get the next 32 unused bits; and
        Convert those bits to an integer value.
    Else if SEMANTICTYPE is string data, then:
        Get the next 16 unused bits from the bitstream;
        Convert those bits to an integer LENGTH;
        Set LENGTHCOUNT to 1;
        Create an empty string S; and
        Loop
            Get the next 16 unused bits;
            Convert to a uni-code character;
            Append the character to the string S; and
            Increment LENGTHCOUNT
        Until LENGTHCOUNT>LENGTH.
    Process the information.
    Increment ITEMCOUNT
Until ITEMCOUNT>NUMITEMS.
```

Figure 5:
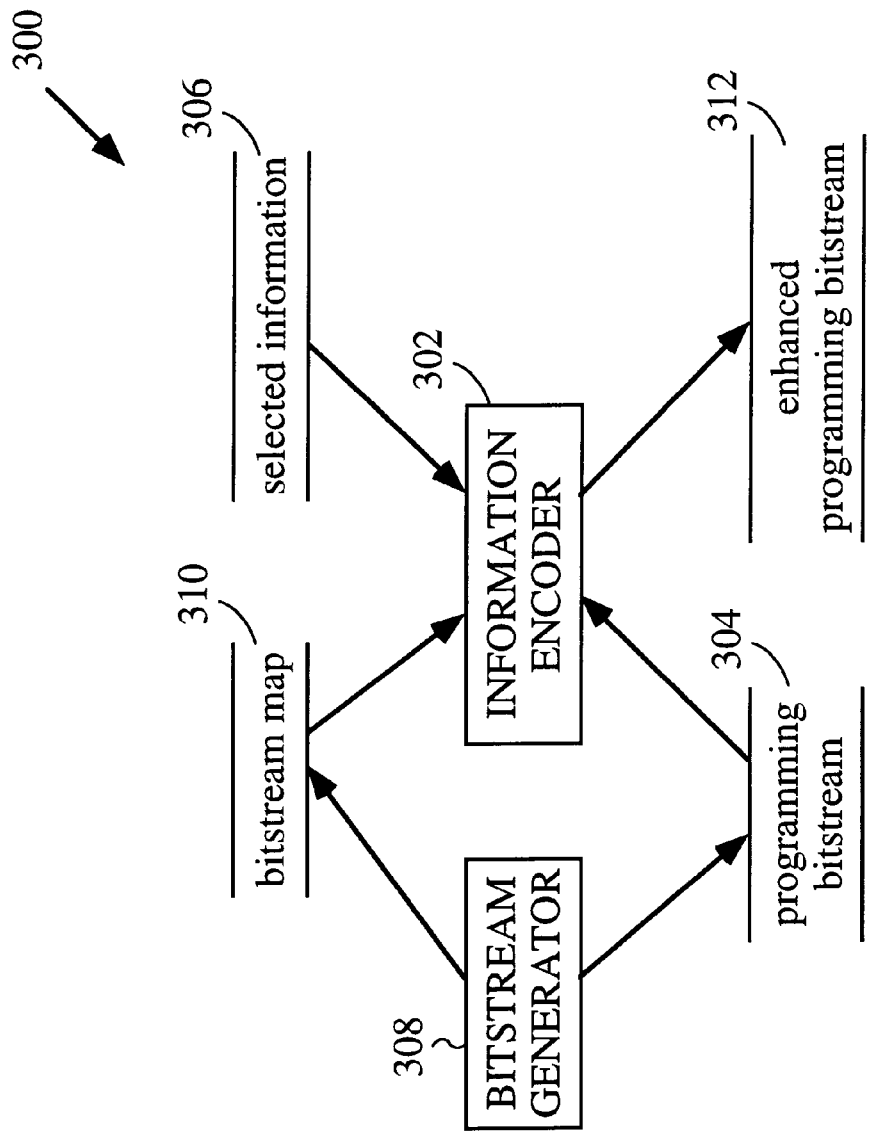
FIG. 5 illustrates a data flow according to a first example embodiment of the present invention.
Figure 6:
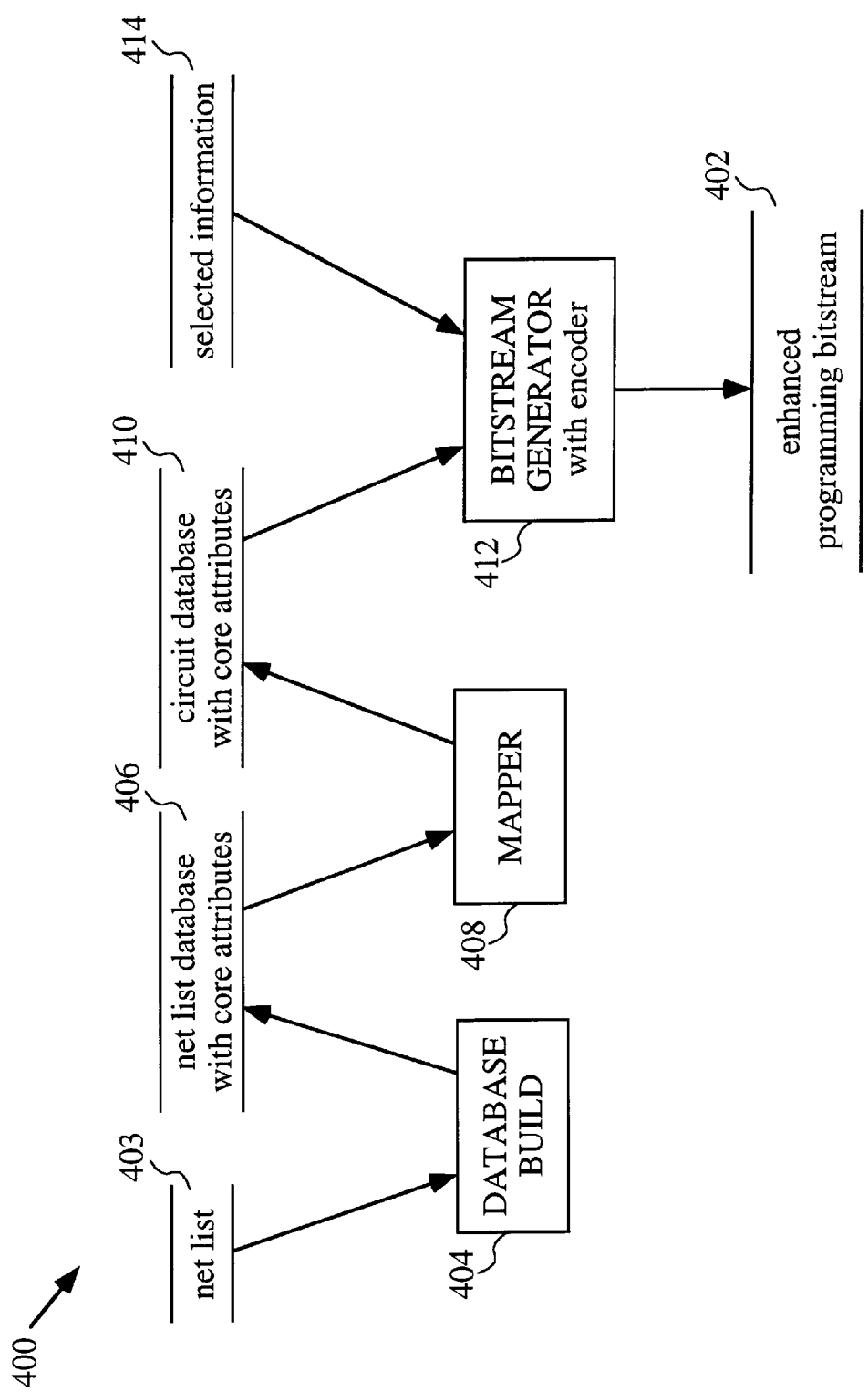
FIG. 6 illustrates a data flow according to a second example embodiment of the present invention.

FIG. 5 illustrates a data flow 300 according to a first example embodiment of the present invention. The embodiment of FIG. 5 includes an information encoder 302 that post-processes a programming bitstream 304 to include selected items of information 306 in unused bit segments, for example 210a–x of bitstream 202 of FIG. 2.

The bitstream generator 308 can be implemented in a manner consistent with the bitstream generator 136 of FIG. 3. Two data items are output by the bitstream generator 308. The first item is programming bitstream 304, and the second item is bitstream map 310. The programming bitstream 304 includes some segments having bits that are used to program the target device and some segments of bits that are not used for programming the device, as illustrated by bitstream 202 of FIG. 4. The bitstream map 310 indicates positions and sizes of the unused bit segments in the programming bitstream 304. For example, relative to programming bitstream 202 of FIG. 4, the bitstream map may include the respective positions of unused bit segments 210a–x relative to the first position in the programming bitstream 202. In addition, if the unused bit segments 210a–x have different sizes, bit-lengths of the unused bit segments are also associated with the unused bit segments.

The information encoder 302, implemented in accordance with the description set forth above, takes as input the programming bitstream 304, bitstream map 310, and the selected items of information 306 and generates an enhanced programming bitstream 312. The selected items of information include, for example, logic core identifiers, software tool identifiers, software version numbers, timestamps, design change identifiers, authenticity codes, design names, design revision levels, design authors and various other types of information. The encoding of the items of information 306 and placement of the encoded information within the bitstream can be accomplished as described in the discussion that accompanies FIG. 4.

FIG. 6 illustrates a data flow 400 according to a second example embodiment of the present invention. The data flow 400 generally corresponds to design flow 100 of FIG. 3 having various modifications made to support generation of an enhanced programming bitstream 402. The enhanced bitstream 402 is essentially the same as enhanced bitstream 312, although it is produced by different example methods.

Net list 403 is input to a database build module 404 and a net list database 406 is produced. The net list database 406 is a Xilinx generic database 125 (FIG. 3), for example. An example item of information to be included in the unused bit segments of a programming bitstream is identification information for logic cores included in the net list. Therefore, the database build module 404 identifies the logic cores, for example by detecting a core generator macro, in the net list and includes attributes such as names and version or revision levels in the net list database 406. From the net list database 406, the mapper module 408 generates a circuit database 410 that also includes the core attributes. The circuit database 410 corresponds to Xilinx circuit description 128 of FIG. 3, for example.

The bitstream generator 412 takes an input circuit database 410, along with the included core attributes, and other selected items of information 414 and generates an enhanced programming bitstream 402. The selected items of information 414 are those described in FIG. 5. In contrast to the example embodiment of FIG. 5, the bitstream generator 412 of FIG. 6 includes the information encoding processing of the information encoder 302 of FIG. 5.

A discussion will now be made of the embodiment in which identifying information is appended to the end of a bitstream. FIGS. 7A, 7B, and 7C show the information provided in a programming bitstream in accordance with such an embodiment. In FIGS. 7A and 7B, a single FPGA is to be configured from a single bitstream. Each separate bitstream includes three regions, a header 701 or 702, configuration data 711 or 712 for the FPGA, and identifying information 721 or 722 related to the bitstream or FPGA. (In the example of FIGS. 7A and 7B, the first FPGA is a larger FPGA than the second, although any combination of sizes may be used and a number of FPGAs greater than two may be used.) Header bits 701 and 702 appear at the beginning of the bitstreams BITSTREAM1 and BITSTREAM2 respectively, and identify the bitstream total length with a length count, and include other information such as redundancy encoding that may be used in the bitstream. (See Erickson, U.S. Pat. No. 5,321,704, for example, incorporated herein by reference.) Following the header 701 or 702 is the configuration data 711 or 712 for configuring the FPGA to implement the desired function. At the end of the bitstream is identifier information 721 or 722, which is either passed through the device and not used, or not passed through the device at all depending upon whether the identifier information has been counted in determining the length count of the header.

If the two FPGAs are working together on the same board, the two FPGAs may be configured from the same bitstream, as shown in FIG. 7C.

As two designs or two parts of one design are partitioned, placed and routed to be implemented by the two FPGAs, the two separate bitstreams BITSTREAM1 and BITSTREAM2 are first generated for the two FPGAs. Once the two separate bitstreams have been generated, a combined bitstream is formed. This combined bitstream includes a header 703 having a length count within it that is the sum of the length counts of headers 701 and 702. The combined bitstream next includes configuration data 711 from BITSTREAM1, configuration data 712 from BITSTREAM2, and finally identifying information 721 from BITSTREAM1 and identifying information 722 from BITSTREAM2. When the two FPGAs are placed into a system board having various integrated circuit devices, they are connected together into a daisy chain as discussed at pages 4-315 through 4-318 of the Xilinx 1998 Programmable Logic Data Book available from Xilinx, Inc., 2100 Logic Drive, San Jose, Calif. 95124, incorporated herein by reference. The bitstream will be loaded into the two FPGAs and the identifying information at the end of the bitstream will be ignored, either by not loading the information into the FPGAs or by passing the information through the FPGAs and out (into nothingness). The identifiers in FIG. 7C are preferably modified to indicate which identifying information corresponds to the first FPGA and which to the second.

The invention applies to bitstreams having other formats as well as those described above. For example, some logic architectures do not use a header but instead use address information as well as data in the bitstream. Unused bits in such a bitstream can be used in the same manner. And for bitstreams not having a specified length, the bitstream can simply be lengthened to include identifying information.

As with other embodiments, the identifying information does not affect the FPGA configuration or function. However, this information can be examined to determine which software was used to generate the bitstream. In particular, the identifying information can be examined to determine whether licensed modules were used to generate part of a design implemented in the FPGA, or whether software having a guarantee of function or performance was used to configure the FPGA.

Accordingly, the present invention provides, among other aspects, a method and system for generating a programming bitstream for a programmable gate array. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for generating a programming bitstream for a programmable gate array comprising:
   generating a complete programming bitstream for the programmable gate array in response to an input design specification, the complete programming bitstream implementing on the programmable gate array a circuit that functions in accordance with the design specification and including a configuration control portion, configuration data, and one or more unused segments, wherein an unused segment includes bits that are not used for programming the programmable gate array;
   encoding one or more items of information to form binary representations of the items; and
   inserting the binary representations into one or more of the unused segments of the complete programming bitstream.

2. The method of claim 1, further comprising:
   generating a map of the programming bitstream identifying the one or more unused segments; and
   referencing the map for insertion of the binary representations into the one or more unused segments.

3. The method of claim 1, wherein the one or more items of information is a logic core identifier.

4. The method of claim 1, wherein the one or more items of information is a software tool identifier.

5. The method of claim 4, wherein the software tool identifier includes a version number.

6. The method of claim 1, wherein the one or more items of information is a timestamp.

7. The method of claim 1, wherein the one or more items of information references one or more design change operations performed on the design specification.

8. The method of claim 1, wherein the one or more items of information is an authenticity code.

9. The method of claim 1, wherein the one or more items of information includes one or more items selected from a group of a design name, a design revision level, and a name of an author.

10. The method of claim 1, further comprising:
    encoding into binary representations item bit lengths of respective ones of the items of information;
    encoding into binary representation a total number of the items of information; and
    inserting the binary representations of the total number and bit lengths into one or more of the unused segments of the programming bitstream.

11. The method of claim 10, further comprising: inserting into the unused segments respective format codes associated with the items of information, each format code indicative of an information type that characterizes an item of information.

12. The method of claim 1, wherein:
    generating the programming bitstream includes inserting a core identifier into a net list responsive to a logic core specification in the design specification; and
    the item is the core identifier.

13. The method of claim 12, wherein generating the programming bitstream includes saving the core identifier in a circuit database responsive to the core identifier in the net list.

14. A method for generating a programming bitstream for a programmable gate array and ascertaining identification information from the programming bitstream, comprising:
    generating a complete programming bitstream for the programmable gate array in response to an input design specification, the complete programming bitstream implementing on the programmable gate array a circuit that functions in accordance with the design specification and including a configuration control portion, configuration data, and one or more unused segments, wherein an unused segment includes bits that are not used for programming the programmable gate array;
    encoding one or more items of information to form binary representations of the items;
    inserting the binary representations into one or more of the unused segments of the complete programming bitstream;
    reading from the unused segments the binary representations;
    decoding the binary representation into the one or more items of information.

15. A method for ascertaining identification information from a complete programming bitstream for a programmable gate array, the complete programming bitstream implementing on the programmable gate array a circuit that functions in accordance with a design specification and including a configuration control portion, configuration data, and one or more unused segments, wherein an unused segment includes bits that are not used for programming the programmable gate array and having encoded therein binary representations of one or more items of information, comprising:

reading from at least one of the unused segments of the complete programming bitstream binary representations of one or more items of information;

decoding the binary representations into the one or more items of information.

16. The method of claim 15, further comprising determining from a map of the programming bitstream locations of the one or more unused segments of the bitstream.

17. The method of claim 16, further comprising:

reading from one or more of the unused segments a total number of items of information encoded in the unused segments;

reading from one or more of the unused segments respective bit lengths of the items of information encoded in the bitstream;

reading a number of bits indicated by the bit lengths for the respective items of information encoded in the bitstream.

18. The method of claim 16, further comprising reading from unused segments of the programming bitstream format codes associated with selected ones of the items of information, each format code indicative of an information type that characterizes an item of information.

19. An apparatus for generating a programming bitstream for a programmable gate array, comprising:

means for generating a complete programming bitstream for the programmable gate array in response to an input design specification, the complete programming bitstream implementing on the programmable gate array a circuit that functions in accordance with the design specification and including a configuration control portion, configuration data, and one or more unused segments, wherein an unused segment includes bits that are not used for programming the programmable gate array;

means for encoding one or more selected items of information to form binary representations of the items; and means for inserting the binary representations into one or more of the unused segments of the complete programming bitstream.

20. A system for generating a programming bitstream for a programmable gate array, comprising:

a bitstream generator configured and arranged to generate a complete programming bitstream responsive to an input design specification, the complete programming bitstream implementing on the programmable gate array a circuit that functions in accordance with the design specification and having a configuration control portion, configuration data, and one or more unused segments that are not used for programming the programmable gate array;

an information encoder coupled to the bitstream generator and configured and arranged to encode one or more selected items of information into respective binary representations and insert the binary representations into one or more of the unused segments of the complete programming bitstream.

* * * * *